United States Patent
Kamo

(10) Patent No.: US 8,916,633 B2
(45) Date of Patent: *Dec. 23, 2014

(54) TAB LEADER TAPE MADE OF POLYPHENYLENE ETHER-BASED RESIN

(75) Inventor: Hiroshi Kamo, Tokyo (JP)

(73) Assignee: Asahi Kasei Chemicals Corporation, Tokyo (JP)

(*) Notice: Subject to any disclaimer, the term of this patent is extended or adjusted under 35 U.S.C. 154(b) by 775 days.

This patent is subject to a terminal disclaimer.

(21) Appl. No.: 12/656,609

(22) Filed: Feb. 4, 2010

(65) Prior Publication Data

US 2010/0168303 A1    Jul. 1, 2010

Related U.S. Application Data

(62) Division of application No. 11/649,162, filed on Jan. 4, 2007.

(51) Int. Cl.
| | | |
|---|---|---|
| H01L 21/60 | (2006.01) | |
| C08K 5/544 | (2006.01) | |
| C08K 3/10 | (2006.01) | |
| C08L 71/12 | (2006.01) | |
| C08G 65/48 | (2006.01) | |
| C08L 67/00 | (2006.01) | |
| H01L 23/14 | (2006.01) | |
| H01L 23/498 | (2006.01) | |
| H01L 23/538 | (2006.01) | |

(52) U.S. Cl.
CPC ........... H01L 23/145 (2013.01); *H01L 23/4985* (2013.01); C08L 71/12 (2013.01); C08G 65/485 (2013.01); *C08L 67/00* (2013.01); *H01L 23/5387* (2013.01)
USPC ........... 524/188; 524/434; 524/436; 525/390; 525/397

(58) Field of Classification Search
CPC ....... C08L 71/12; C08L 71/123; C08L 67/00; H01L 23/145; H01L 23/4985; H01L 23/5387
USPC .......... 428/147; 524/394, 432, 439, 441, 500, 524/100, 127, 389, 399, 400, 492, 550; 525/397, 437
See application file for complete search history.

(56) References Cited

U.S. PATENT DOCUMENTS

| | | | | |
|---|---|---|---|---|
| 4,841,099 A | * | 6/1989 | Epstein et al. | 174/258 |
| 5,508,107 A | * | 4/1996 | Gutman et al. | 428/339 |
| 5,521,756 A | * | 5/1996 | Meier et al. | 359/391 |
| 5,631,079 A | * | 5/1997 | Gutman et al. | 428/327 |
| 5,914,186 A | * | 6/1999 | Yau et al. | 428/327 |
| 6,033,128 A | * | 3/2000 | Krais et al. | 396/415 |
| 6,194,497 B1 | * | 2/2001 | Willems et al. | 524/165 |
| 6,451,238 B1 | * | 9/2002 | Suzuki et al. | 264/250 |
| 6,759,460 B2 | | 7/2004 | Kamo et al. | |
| 6,815,485 B2 | | 11/2004 | Kamo | |
| 7,851,271 B2 | * | 12/2010 | Kamo et al. | 438/127 |
| 2003/0050374 A1 | * | 3/2003 | Kamo | 524/394 |
| 2006/0010974 A1 | * | 1/2006 | Koyano et al. | 73/431 |
| 2007/0003763 A1 | | 1/2007 | Kamo et al. | |
| 2007/0270530 A1 | | 11/2007 | Kamo et al. | |
| 2007/0290391 A1 | | 12/2007 | Kamo et al. | |

FOREIGN PATENT DOCUMENTS

| | | | |
|---|---|---|---|
| JP | 05299472 A | * | 11/1993 |
| JP | 2002-299391 | | 10/2002 |
| JP | 2004-211084 | | 7/2004 |
| JP | 2004211084 A | * | 7/2004 |
| JP | 2005-41930 | | 2/2005 |
| JP | 2006-1977 | | 1/2006 |

OTHER PUBLICATIONS

Machine Translation of JP 05-299472 A.*
Machine Translation of JP 2004-211084 A.*
Machine Translation of JP 2004-211084A.
Al-Sarawi Said F. (Mar. 1997) Tape-Automated Bonding. Centre for High Performance Integrated Technologies and Systems (CHIPTEC) Available online at: http//www.eleceng.adelaide.edu/au/Personal/alsarawi/node8.html.
U.S. Appl. No. 11/649,162, filed Jan. 4, 2007, Hiroshi Kamo, Asahi Kasei Chemicals Corporation.
Advisory Action issued Aug. 10, 2009 in U.S. Appl. No. 11/649,162.
Final Office Action issued Mar. 23, 2009 in U.S. Appl. No. 11/649,162.
Final Office Action issued Feb. 25, 2009 in U.S. Appl. No. 11/649,162.
Office Action issued Oct. 6, 2008 in U.S. Appl. No. 11/649,162.

* cited by examiner

*Primary Examiner* — Bijan Ahvazi
*Assistant Examiner* — Ronald Grinsted
(74) *Attorney, Agent, or Firm* — Staas & Halsey LLP

(57) ABSTRACT

A film is used as a TAB leader tape. The film comprises 45 parts by mass or more of a polyphenylene ether-based resin and 55 parts by mass or less of at least one component selected from a thermoplastic resin and a plasticizer based on 100 parts by mass of the film. The film optionally includes inorganic filler and other additional components.

5 Claims, 1 Drawing Sheet

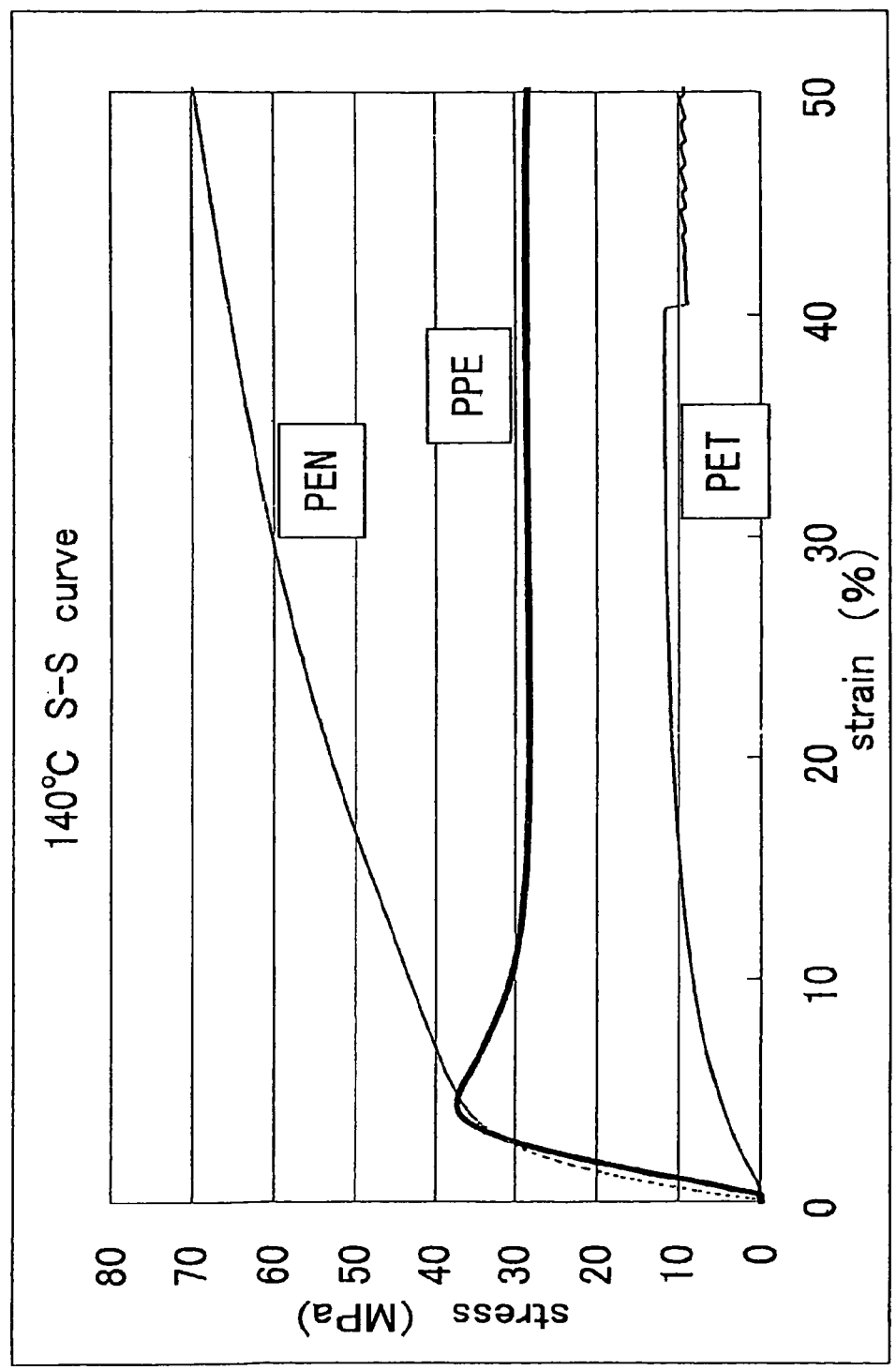

TAB LEADER TAPE MADE OF POLYPHENYLENE ETHER-BASED RESIN

CROSS-REFERENCE TO RELATED APPLICATIONS

This application is a divisional of U.S. patent application Ser. No. 11/649,162, filed Jan. 4, 2007, which is pending.

BACKGROUND OF THE INVENTION

1. Field of the Invention

The present invention relates to a TAB leader tape comprising a polyphenylene ether-based resin excellent in resistance to water absorption.

2. Description of the Related Art

A printed tape having many semiconductor devices automatically mounted thereon, namely, a tape for tape automated bonding (hereinafter referred to as TAB), is wound around a reel in a form carried on a spacer tape for protecting the tape. A TAB leader tape used in mounting semiconductor drivers is connected to TAB tapes, in the winding start and winding end.

The TAB leader tape is required to have heat resistance to exhibit no deformation even under heating in an oven in the process of curing a sealing agent for semiconductor devices mounted on TAB; thus, a super engineering plastic such as polyimide, polyether imide, and polyethylene naphthalate is used as a material thereof. Specifically, a polyimide film is used for applications in which the lead tape is employed at a temperature of 180° C. or lower; polyether imide is employed for applications in which the lead tape is employed at a temperature of 160° C. or lower.

The TAB leader tape has been poorly discussed for necessary performances thereof other than heat resistance perhaps because it is used only in a small amount on the winding start and winding end of a TAB tape; it has probably been thought that the mounting can just have to be carried out at an acceptable cost. For example, Japanese Patent Laid-Open No. 2002-29939 discloses a biaxially oriented film containing polyethylene-2,6-naphthalenedicarboxylate as a main component, the film being a polyester film for use in a TAB leader tape, having a film thickness of 75 μm or more. It is further disclosed that instead of employing an extremely expensive film having high heat resistance, the use of this polyester film also imparts heat resistance to an extent durable for practical use to the lead tape; necessary performances other than heat resistance are not addressed although attention is directed toward the high cost of a super engineering plastic.

However, as a result of studies by the present inventors, it has been found that a TAB leader tape comprising a super engineering plastic is highly water-absorbing and has a limitation to the frequency of recycling. It has been also shown that when guide holes for meshing with a roll are punched out in opposite sides of a tape material for a TAB leader tape, as burrs, elongated whisker-like pieces project from the tape and powder is generated. The elongated whisker-like pieces generated as burrs are particularly problematic because they can be injurious to semiconductor devices. A TAB leader tape comprising polyethylene-2,6-naphthalenedicarboxylate also has problems, e.g., that it is highly water-absorbing, generates burrs when punched out, and is large in dimension change due to water absorption and temperature dependency of elastic modulus.

Thus, an object of the present invention is to provide a TAB leader tape excellent in resistance to water absorption.

BRIEF SUMMARY OF THE INVENTION

As a result of intensive studies of technologies for achieving the above-described object, the present inventor has found that a TAB leader tape 45 parts by mass or more of whose resin component is a polyphenylene ether-based resin is excellent in resistance to water absorption, thereby accomplishing the present invention.

Thus, the TAB leader tape of the present invention comprises 45 parts by mass or more of a polyphenylene ether-based resin based on 100 parts by mass of the resin component thereof.

The content of the polyphenylene ether-based resin is preferably 70 parts by mass or more, particularly preferably 90 parts by mass or more based on 100 parts by mass of the resin component constituting the TAB leader tape. The content of the polyphenylene ether is preferably 50 to 99.5 parts by mass based on 100 parts by mass of the polyphenylene ether-based resin. The resin component of the TAB leader tape preferably comprises a liquid crystalline polyester in addition to the polyphenylene ether-based resin. The resin component preferably comprises 50 to 99.5 parts by mass of the polyphenylene ether-based resin and 0.5 to 50 parts by mass of the liquid crystalline polyester, and more preferably comprises 70 to 99.5 parts by mass of the polyphenylene ether-based resin and 0.5 to 30 parts by mass of the liquid crystalline polyester.

The polyphenylene ether-based resin preferably comprises 50 to 99.5 parts by mass of the polyphenylene ether and 0.5 to 50 parts by mass of an aromatic vinyl-based polymer, and more preferably comprises 70 to 99.5 parts by mass of the polyphenylene ether and 0.5 to 30 parts by mass of the aromatic vinyl-based polymer.

When the TAB leader tape comprises the liquid crystalline polyester, it preferably also contains a compound comprising one of monovalent, divalent, trivalent, and tetravalent metal elements. The preferred content of the metal compound is 0.1 to 10 parts by mass based on the total 100 parts by mass of the polyphenylene ether-based resin and a resin other than the polyphenylene ether-based resin. The one of monovalent, divalent, trivalent, and tetravalent metal elements is particularly preferably at least one of a Zn element and a Mg element. In addition, the TAB leader tape preferably contains a silane compound. The preferred content of the silane compound is 0.1 to 5 parts by mass based on the total 100 parts by mass of the polyphenylene ether-based resin and a resin other than the polyphenylene ether-based resin. The silane compound particularly preferably has an amino group.

The TAB leader tape preferably contains an inorganic filler. The preferred content of the inorganic filler is (a) 0.1 to 150 parts by mass based on 100 parts by mass of the polyphenylene ether-based resin when the resin component is composed only of the resin and (b) 0.1 to 150 parts by mass based on the total 100 parts by mass of the polyphenylene ether-based resin and a resin other than the polyphenylene ether-based resin when the resin component is composed of these resins.

The TAB leader tape of the present invention is excellent in resistance to water absorption.

BRIEF DESCRIPTION OF THE DRAWINGS

FIG. 1 is a graph showing stain-stress curves (S-S curve) of a polyphenylene ether (PPE) film obtained in Example 1, a polyethylene naphthalate (PEN) film manufactured by Teijin Chemicals Ltd., and a polyethylene terephthalate (PET) film manufactured by Toray Industries, Inc.

DETAILED DESCRIPTION OF THE PREFERRED EMBODIMENTS

Forty-five parts by mass or more of the resin component of the TAB leader tape is a polyphenylene ether-based resin, and 55 parts by mass or less thereof is composed of a component other than the polyphenylene ether-based resin, shown below as component B. In addition to these resin components, the TAB leader tape may contain one of monovalent, divalent, trivalent, and tetravalent metal compounds; a silane compound; an inorganic filler other than the metal compound; and so on.

1. Components (1-A) Polyphenylene Ether-Based Resin (Hereinafter Also Referred to as Component A)

The polyphenylene ether-based resin includes a resin composed only of a polyphenylene ether, and a mixture of a polyphenylene ether and an aromatic vinyl-based polymer. The content of the polyphenylene ether-based resin is 45 parts by mass or more, preferably 70 parts by mass or more, particularly preferably 90 parts by mass based on 100 parts by mass of the resin component constituting the TAB leader tape.

The resin composed only of a polyphenylene ether is difficult to process using conventional melt extrusion because it has an extremely high melt viscosity, but can be molded by, for example, a solution casting into a film. In view of moldability, the content of the polyphenylene ether is preferably 99.5 parts by mass or less, more preferably 99 parts by mass or less, particularly preferably 98 parts by mass or less based on 100 parts by mass of the polyphenylene ether-based resin when the total mass amount thereof is regarded as 100 parts by mass.

The glass transition temperature (Tg) of the polyphenylene ether-based resin is preferably 150° C. or higher, more preferably 170° C. or higher, particularly preferably 190° C. or higher in view of the heat resistance and heat shrinkability of the TAB leader tape. A polyphenylene ether content of about 45 parts by mass or more based on 100 parts by mass of the polyphenylene ether-based resin when the total mass amount thereof is regarded as 100 parts by mass provides a Tg of 150° C. or higher; about 60 parts by mass or more provides a Tg of 170° C. or higher; and about 75 parts by mass or more provides a Tg of 190° C. or higher. The Tg can be determined by a general method, but can be also determined in a simple manner, using a differential scanning calorimeter (DSC). For obtaining the Tg using DSC, for example, the transition temperature based on the polyphenylene ether-based resin is determined when a sample is cut out of the TAB leader tape, scanned from 50° C. to 300° C. at a rate of temperature increase of 20° C./min., and kept at the temperature for one minute, followed by scanning from 300° C. to 50° C. at a rate of temperature decrease of 20° C./min., keeping the sample at the temperature for one minute and further scanning from 50° C. to 300° C. at a rate of temperature increase of 20° C./min.

The polyphenylene ether is at least one of a homopolymer and a copolymer which comprise a repeating unit structure represented by formula I below and have a reduced viscosity (as measured in a 0.5 g/dl chloroform solution at 30° C.) ranging from 0.15 to 1.0 dl/g. The preferred reduced viscosity is in the range of from 0.20 to 0.70 dl/g, most preferably from 0.40 to 0.60 dl/g.

[Formulation 1]

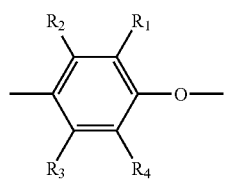

(Formula 1)

(wherein $R_1$ and $R_4$ are each independently one of hydrogen, primary and secondary lower alkyl, phenyl, aminoalkyl, and hydrocarbonoxy; $R_2$ and $R_3$ are each independently one of hydrogen, primary and secondary lower alkyl, and phenyl.)

Examples of the polyphenylene ether specifically include poly(2,6-dimethyl-1,4-phenylene ether), poly(2-methyl-6-ethyl-1,4-phenylene ether), poly(2-methyl-6-phenyl-1,4-phenylene ether), and poly(2,6-dichloro-1,4-phenylene ether), and also include polyphenylene ether copolymers such as copolymers of 2,6-dimethylphenol and other phenols (for example, 2,3,6-trimethylphenol and 2-methyl-6-butylphenol). Among others, preferred are poly(2,6-dimethyl-1,4-phenylene ether) and a copolymer of 2,6-dimethylphenol and 2,3,6-trimethylphenol; poly(2,6-dimethyl-1,4-phenylene ether) is more preferable.

Examples of a method for producing the polyphenylene ether include a method involving oxidation polymerizing 2,6-xylenol using a complex of a cuprous salt and an amine as described in U.S. Pat. No. 3,306,874 specification.

Methods as described, for example, in the specifications of U.S. Pat. Nos. 3,306,875, 3,257,357, and 3,257,358 and the publications of Japanese Patent Publication No. 52-17880 and Japanese Patent Laid-Open Nos. 50-51197 and 63-152628 are also preferable as methods for producing the polyphenylene ether.

The polyphenylene ether may be used directly in the form of a powder obtained by polymerization, or may be pelletized by melt kneading in a nitrogen or non-nitrogen atmosphere and then under devolatilization or non-devolatilization conditions.

The polyphenylene ethers also include polyphenylene ethers functionalized with various dienophile compounds. Examples of various dienophile compounds include, for example, compounds such as maleic anhydride, maleic acid, fumaric acid, phenylmaleimide, itaconic acid, acrylic acid, methacrylic acid, methyl acrylate, methyl methacrylate, glycidyl acrylate, glycidyl methacrylate, stearyl acrylate, and styrene. A method for functionalization thereof with these dienophile compounds may also involve functionalization in a molten state under devolatilization or non-devolatilization conditions using, for example, an extruder in the presence or absence of a radical generator. Alternatively, the functionalization may be carried out in a non-molten state, i.e., in a temperature range between room temperature or higher and melting point or lower in the presence or absence of a radical generator. Here, the melting point of the polyphenylene ether is defined as the peak top temperature of a peak observed on a temperature-heat flow graph obtained when heating up at 20° C./minute in measurement using a differential scanning calorimeter (DSC); when a plurality of peak top temperatures are present, the melting point is defined as the highest of these temperatures.

The aromatic vinyl-based polymer refers to a homopolymer or copolymer consisting mainly of an aromatic vinyl compound. Examples of the aromatic vinyl compound include styrene, α-methylstyrene, vinyltoluene, p-tert-butylstyrene, and diphenylethylene, which may be used alone or a mixture of two kinds or more thereof; among others, styrene is preferable. Examples of the aromatic vinyl-based polymer include atactic polystyrene, high impact polystyrene, syndiotactic polystyrene, and acrylonitrile-styrene copolymer.

A mixture of the polyphenylene ether and the aromatic vinyl-based polymer can be easily molded as compared to a resin composed only of the polyphenylene ether; however, an excessive content of the aromatic vinyl-based polymer may lead to the impairment of characteristics such as heat resistance. In view of moldability and heat resistance, the preferred content of the aromatic vinyl-based polymer is 0.5 to 50 parts by mass, more preferably 1 to 35 parts by mass, particularly preferably 2 to 30 parts by mass based on 100 parts by mass of the polyphenylene ether-based resin. An aromatic vinyl-based polymer content of 30 parts by mass or less based on 100 parts by mass of the polyphenylene ether-based resin leads to the distortion temperature under load (DTUL) (using ASTM D648 under a load of 1.82 MPa at a test piece thickness of 3.2 mm) of the polyphenylene ether-based resin tending to have a preferable value of 150 to 190° C.

(1-B) Component Other than the Polyphenylene Ether-Based Resin (Hereinafter Referred to as Component B)

The component other than the polyphenylene ether-based resin may be any component which can confer flowability while maintaining the heat resistance of the polyphenylene ether, and is selected from at least one of a thermoplastic resin and a plasticizer, and blended to such an extent that the advantages of the present invention are not impaired. Examples of the thermoplastic resin include, in addition to liquid crystalline polyesters, semiaromatic polyesters typified by polyethylene terephthalate, polybutylene terephthalate, and polytrimethylene terephthalate; polyamides typified by polyamide 6, polyamide 6,6, polyamide 6T, and polyamide 9T; polyolefins typified by polyethylene, and polypropylene; polyvinyl chloride, polyvinylidene chloride, and polyvinylidene fluoride; polyacrylic polymers typified by polymethyl methacrylate, polymethyl acrylate, polymethacrylic acid, and polyacrylic acid; thermoplastic polyimide; copolymers of acrylic monomers and olefins; and polyurethane. Examples of the plasticizer include hindered phenols; phosphates; paraffinic oils; low molecular weight polyethylene; epoxidized soybean oil; polyethylene glycol; fatty acid esters; and organophosphates and phosphazene compounds widely known as flame retardants for polyphenylene ethers.

The liquid crystalline polyester is a polyester called a thermotropic liquid crystalline polymer, may be a known one without any specific limitation. Examples thereof include a thermotropic liquid crystalline polymer comprising p-hydroxybenzoic acid and polyethylene terephthalate as main constitutional units, a thermotropic liquid crystalline polymer comprising p-hydroxybenzoic acid and 2-hydroxy-6-naphthoic acid as main constitutional units, and a thermotropic liquid crystalline polymer comprising p-hydroxybenzoic acid, 4,4'-dihydroxybiphenyl, and terephthalic acid as main constitutional units. The liquid crystalline polyester is preferably composed of at least one of structural units (I) and (II) below and, as needed, at least one of structural units (III) and (IV) below.

[Formulation 2]

(I)

[Formulation 3]

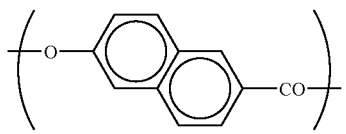

(II)

[Formulation 4]

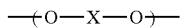

(III)

[Formulation 5]

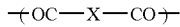

(IV)

Here, the structural units (I) and (II) are a structural unit of a polyester produced from p-hydroxybenzoic acid and a structural unit produced from 2-hydroxy-6-naphthoic acid, respectively. A TAB leader tape comprising a liquid crystalline polyester having the structural units (I) and (II) is excellent in heat resistance and has the good balance of mechanical characteristics such as flowability and rigidity. Xs in the above structural units (III) and (N) are each independently one kind or more selected from formulas (2).

[Formulation 6]

(Formulas 2)

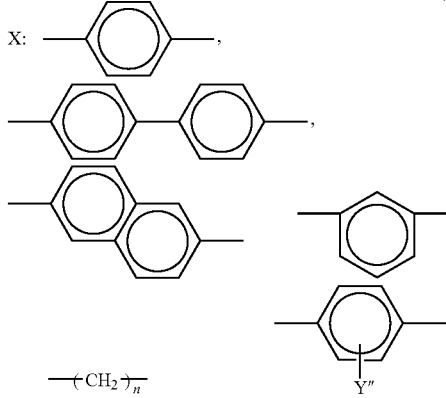

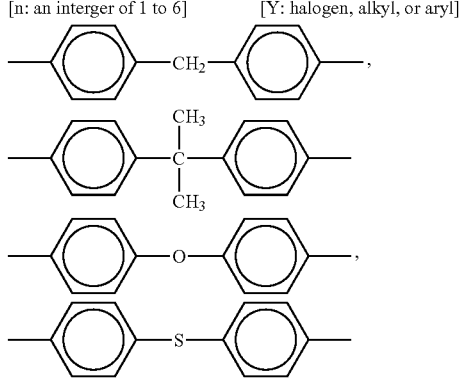

The structural formula (III) is preferably a structural unit produced from each of ethylene glycol, hydroquinone, 4,4'-dihydroxybiphenyl, 2,6-dihydroxynaphthalene, and bisphenol A, more preferably a structural unit produced from each of ethylene glycol, 4,4'-dihydroxybiphenyl, and hydroquinone, particularly preferably a structural unit produced from each of ethylene glycol and 4,4'-dihydroxybiphenyl.

The structural formula (IV) is preferably a structural unit produced from each of terephthalic acid, isophthalic acid, and 2,6-dicarboxynaphthalene, more preferably a structural unit produced from each of terephthalic acid and isophthalic acid.

The structural formulas (III) and (IV) can be each used in combination of at least one kind or more of the above-listed structural units. In the case of the combined use of two kinds or more, specific examples of the structural formula (III) can include (1) a structural unit produced from ethylene glycol/a structural unit produced from hydroquinone, (2) a structural unit produced from ethylene glycol/a structural unit produced from 4,4'-dihydrobiphenyl, and (3) a structural unit produced from hydroquinone/a structural unit produced from 4,4'-dihydrobiphenyl.

Such specific examples of the structural formula (IV) can include (1) a structural unit produced from terephthalic acid/a structural unit produced from isophthalic acid and (2) a structural unit produced from terephthalic acid/a structural unit produced from 2,6-dicarboxynaphthalene. Here, based on the total weight of the two components, terephthalic acid preferably has a content of 40 wt % or more, more preferably 60 wt % or more, particularly preferably 80 wt % or more. Terephthalic acid of 40 wt % or more based on the total weight of the two components makes the resin composition relatively excellent in flowability and heat resistance. The usage proportions of the structural units (I), (II), (III), and (IV) in the liquid crystalline polyester are not particularly limited. However, the structural units (III) and (IV) are essentially in nearly equimolar amounts.

The following structural unit (V) consisting of the structural units (III) and (IV) may be also used as a structural unit in the liquid crystalline polyester. Specific examples thereof can include (1) a structural unit produced from ethylene glycol and terephthalic acid, (2) a structural unit produced from hydroquinone and terephthalic acid, (3) a structural unit produced from 4,4'-dihydroxybiphenyl and terephthalic acid, (4) a structural unit produced from 4,4'-dihydroxybiphenyl and isophthalic acid, and (5) a structural unit produced from bisphenol A and terephthalic acid.

[Formulation 7]

$$\leftarrow O-X-OCO-X-CO\rightarrow \quad (V)$$

The liquid crystalline polyester component may also comprise, as needed, other structural units produced from an aromatic dicarboxylic acid, an aromatic diol, and an aromatic hydroxycarboxylic acid in the range of such small amounts that the advantages of the present invention are not impaired.

The temperature of the liquid crystalline polyester starting to show a liquid crystalline state when melted (hereinafter referred to as liquid crystal starting temperature) is preferably 150 to 350° C., more preferably 180 to 320° C. Setting the liquid crystal starting temperature to the range is preferable because black inclusions (substances considered to be mainly formed by gelation of PPE) are decreased in the resultant resin sheet.

(1-C) Monovalent, Divalent, Trivalent, or Tetravalent Metal Compound (Hereinafter Referred to as Component C)

The TAB leader tape preferably contains a compound comprising one of monovalent, divalent, trivalent, and tetravalent metal elements (hereinafter simply referred to as a metal compound). The metal compound may be essentially any compound which comprises a metal element as a main component, and may be an inorganic or organic compound. The one of monovalent, divalent, trivalent, and tetravalent metal elements may be any of the metal elements which can take these valences; specific examples thereof include Li, Na, K, Zn, Cd, Sn, Cu, Ni, Pd, Co, Fe, Ru, Mn, Pb, Mg, Ca, Sr, Ba, Al, Ti, Ge, and Sb. Among others, Zn, Mg, Ti, Pb, Cd, Sn, Sb, Ni, Al, and Ge elements are preferable; Zn, Mg, and Ti elements are more preferable. In view of producing no delamination and greatly improving the sheet toughness, the metal element is more preferably at least one of Zn and Mg elements, particularly preferably a Zn element.

The metal compound is preferably an oxide, hydroxide, alkoxide salt, aliphatic carboxylate, or acetate of each of the above-described metal elements. Preferred examples of the oxide include ZnO, MgO, TiO$_4$, TiO$_2$, PbO, CdO, SnO, SbO, Sb$_2$O$_3$, NiO, Al$_2$O$_3$, and GeO. Preferred examples of the hydroxide include Zn(OH)$_2$, Mg(OH)$_2$, Ti(OH)$_4$, Ti(OH)$_2$, Pb(OH)$_2$, Cd(OH)$_2$, Sn(OH)$_2$, Sb(OH)$_2$, Sb(OH)$_3$, Ni(OH)$_2$, Al(OH)$_3$, and Ge(OH)$_2$. Preferred examples of the alkoxide salt include Ti(O-iso-Pr)$_4$ and Ti(O-n-Bu)$_4$. Preferred examples of the aliphatic carboxylate include zinc stearate, magnesium stearate, titanium stearate, lead stearate, cadmium stearate, tin stearate, antimony stearate, nickel stearate, aluminium stearate, and germanium stearate. Preferred examples of the acetate include zinc acetate, magnesium acetate, titanium acetate, lead acetate, cadmium acetate, tin acetate, antimony acetate, nickel acetate, aluminium acetate, germanium acetate, and titanium acetate.

Of these metal compounds, more preferred examples include ZnO, Mg(OH)$_2$, Ti(O-iso-Pr)$_4$, Ti(O-n-Bu)$_4$, zinc acetate, zinc stearate, and aluminium stearate. In view of producing no delamination, at least one of ZnO and Mg(OH)$_2$ is more preferable; ZnO is particularly preferable. The metal compound may also contain impurities in such a range that the advantages of the present invention are not impaired.

The metal compound acts as an agent for mixing the polyphenylene ether-based resin and the liquid crystalline polyester to reduce the delamination thereof. Thus, when the TAB leader tape comprising the liquid crystalline polyester also contains the metal compound, the generation of whisker-like pieces as burrs and powder is reduced in punching out the guide holes. The tape is excellent in punchability, so to speak.

(1-D) Silane Compound (Hereinafter Referred to as Component D)

The silane compound refers to a functional group-containing silane compound, and is a silane compound containing at least one functional group selected from the group consisting of an amino group, a ureido group, an epoxy group, an isocyanate group, and a mercapto group. The functional group-containing silane compound may be typically one containing any one of these functional groups in the molecule, but, in some cases, may be also one containing two or more of these functional groups in the molecule.

The preferred silane compound is an alkoxysilane containing a functional group described above in the molecule. Specific examples of the functional group-containing silane compound include amino group-containing silane compounds such as γ-aminopropyltrimethoxysilane, γ-aminopropyltriethoxysilane, γ-aminopropylmethyldimethoxysilane, N-(β-aminoethyl)-γ-aminopropyltrimethoxysilane, N-(β-aminoethyl)-γ-aminopropylmethyldimethoxysilane, and γ-phenyl-γ-aminopropyltrimethoxysilane; and ureido group-containing silane compounds such as γ-ureidopropyltrimethoxysilane, γ-ureidopropylmethyltrimethoxysilane, γ-ureidopropyltriethoxysilane, γ-ureidopropylmethyltriethoxysilane, and γ-(2-ureidoethyl)aminopropyltrimethoxysilane.

Specific examples thereof also include epoxy group-containing silane compounds such as γ-glycidoxypropyltrimethoxysilane, γ-glycidoxypropyldimethylmethoxysilane, γ-glycidoxypropyltriethoxysilane, γ-glycidoxypropylmethyldiethoxysilane, β-(3,4-epoxycyclohexypethyltrimethoxysilane, and β-(3,4-epoxycyclohexypethyltriethoxysilane; and isocyanate group-containing silane compounds such as γ-isocyanatepropyltrimethoxysilane, γ-isocyanatepropylmethyldimethoxysilane, γ-isocyanatepropyltriethoxysilane, γ-isocyanatepropylmethyldiethoxysilane, γ-isocyanatepropylethyldimethoxysilane, γ-isocyanatepropylethyldiethoxysilane, and γ-isocyanatepropyltrochlorosilane.

In addition, specific examples thereof include mercapto group-containing silane compounds such as γ-mercaptopropylmethyldimethoxysilane, γ-mercaptopropyltriethoxysilane, γ-mercaptopropylethyldiethoxysilane, γ-mercaptopropylmethyldiethoxysilane, β-mercaptoethyltrimethoxysilane, β-mercaptoethyltriethoxysilane, and β-mercaptoethyldimethoxysilane.

Like the metal compound, the silane compound also acts as an agent for mixing the polyphenylene ether-based resin and the liquid crystalline polyester; therefore, when the TAB leader tape comprising the liquid crystalline polyester also contains the silane compound, the tape is excellent in punchability.

(1-E) Inorganic Filler (Hereinafter Referred to as Component E)

The inorganic filler is an inorganic compound other than the above-described metal compound, and preferably one imparting strength to TAB leader tape made of the polyphenylene ether-based resin. Examples of the strength-imparting agent include glass fiber, metal fiber, potassium titanate, carbon fiber, silicon carbide, ceramic, silicon nitride, mica, nepheline syenite, talc, wollastonite, slag fiber, ferrite, glass bead, glass powder, glass balloon, quartz, quartz glass, fused silica, titanium oxide, and calcium carbonate. Among others, calcium carbonate, talc, wollastonite, and fused silica are preferable in view of sheet forming and thermal shrinkage rate.

The form of these inorganic fillers is not intended to be limited and may be optionally selected from forms such as fiber, a plate, and a sphere, but plate and sphere forms are preferable in view of sheet forming and thermal shrinkage rate. These inorganic fillers may be used in combination of two kinds or more thereof. In addition, the filler may be used, as needed, by pretreating with a coupling agent such as silanic and titanic ones for use.

(1-F) Other Added Components (Hereinafter Referred to as Component F)

In addition to the above-described components, other additional components including, for example, an antioxidant, an elastomer (an olefinic copolymer such as ethylene/propylene copolymer, ethylene/1-butene copolymer, ethylene/propylene/non-conjugated diene copolymer, ethylene/ethyl acrylate copolymer, ethylene/glycidyl methacrylate copolymer, and ethylene/vinyl acetate/glycidyl methacrylate copolymer, ethylene/propylene-g-maleic anhydride copolymer, and ABS; polyester-polyether elastomer; polyester-polyester elastomer; a vinyl aromatic compound-conjugated diene compound block copolymer; or a hydrogenated product of a vinyl aromatic compound-conjugated diene compound block copolymer), a flame retardant auxiliary, a weather resistance-improving agent, a light resistance-improving agent, a nucleating agent for polyolefins, and various colorants may be added as needed in such a range that the advantages of the present invention are not impaired.

2. Production Method (2-a) Content

The content of the polyphenylene ether-based resin is preferably 50 parts by mass or more in view of preventing the thickness nonuniformity and delamination of the tape, and preferably 99.5 parts by mass or less, more preferably 70 to 99.5 parts by mass, still more preferably 75 to 98 parts by mass in view of the flowability of the resin composition and extruder torque (load on the extruder) during sheeting and thermal shrinkage rate, based on the total 100 parts by mass of the polyphenylene ether-based resin and a resin other than the polyphenylene ether-based resin.

The blending amount of the resin other than the polyphenylene ether-based resin is preferably 0.5 to 50 parts by mass, more preferably 1 to 30 parts by mass, particularly preferably 2 to 25 parts by mass based on the total 100 parts by mass of the polyphenylene ether-based resin and the resin other than the polyphenylene ether-based resin in view of thermal shrinkage rate.

When the resin component is the polyphenylene ether-based resin and the liquid crystalline polyester, the blending amount of the liquid crystalline polyester is preferably 0.5 parts by mass or more in view of flowability and the prevention of occurrence of black inclusions in the sheet, and preferably 50 parts by mass or less, more preferably 0.5 to 30 parts by mass, still more preferably 2 to 25 parts by mass in view of preventing the thickness nonuniformity of the sheet due to the anisotropy of the liquid crystalline polyester, based on the total 100 parts by mass of the polyphenylene ether-based resin and the liquid crystalline polyester.

The preferred contents of the metal compound, silane compound, and inorganic filler will be described based on the total 100 parts by mass of the polyphenylene ether-based resin and a resin other than the polyphenylene ether-based resin.

The preferred content of the metal compound is 0.1 part by mass or more in view of preventing the delamination of the sheet, and 10 parts by mass or less, more preferably 0.2 to 5 parts by mass, particularly preferably 0.4 to 3 parts by mass in view of the density and heat resistance of the composition.

The preferred content of the silane compound is 0.1 part by mass or more in view of preventing the delamination of the sheet, and 5 parts by mass or less, more preferably 0.2 to 3 parts by mass, particularly preferably 0.3 to 1 part by mass in view of the stability and weather resistance of the composition.

The metal compound and the silane compound may be used in combination.

The preferred content of the inorganic filler is 0.1 to 150 parts by mass, and more preferably 1 to 100 parts by mass, still more preferably 2 to 20 parts by mass particularly in view of sheet forming and thermal shrinkage rate.

(2-b) Kneading Step

When the polyphenylene ether-based resin is kneaded with at least one of the metal compound, the silane compound, and the inorganic filler, or when the polyphenylene ether-based resin and the liquid crystalline polyester are kneaded with at least one of the metal compound, the silane compound, and the inorganic filler, the order of kneading is not particularly limited, but it is desirable, in view of process simplicity and the improvement of physical properties, that these components are collectively kneaded. However, when the metal compound and the silane compound are used in combination, these compounds may be simultaneously kneaded with the polyphenylene ether-based resin or the polyphenylene ether-based resin and liquid crystalline polyester, but in order to inhibit delamination of the sheet more effectively, it is desirable that the metal compound is kneaded therewith before the silane compound is kneaded with the kneaded product, or that the silane compound is kneaded therewith before the metal compound is kneaded with the kneaded product. The inorganic filler may be also kneaded with the other kneaded components when it is desired for the filler to be prevented from being crushed by kneading.

The resin composition can be produced by various methods. Examples thereof include heat melt kneading methods using a single-screw extruder, a twin-screw extruder, a roll, a kneader, a Brabender Plastograph, a Banbery mixer and the like; among others, the melt kneading method using a twin-screw extruder is most preferable. In this case, the melt kneading temperature is not intended to be particularly limited, but may typically be optionally selected from the range of 150 to 350° C.

(2-c) Forming Step

The TAB leader tape may be produced by slitting a sheet once made into a tape form, or may be produced by continuously slitting a sheet directly from a sheeting machine into a tape form. Here, the TAB leader tape has a thickness of 0.001 to 2.0 mm, preferably 0.005 to 0.50 mm, more preferably 0.05 to 0.20 mm. The tape may be occasionally called a film. Its suitable thickness is often, 0.075 mm, 0.125 mm or the like.

The TAB leader tape has a width of 10 to 100 mm, preferably 20 to 90 mm, more preferably 30 to 80 mm. Widths of, for example, 35 mm, 48 mm, and 70 mm are often suitable.

The TAB leader tape has the above-described width and thickness and guide holes about 0.5 to 2 mm square in opposite sides thereof, punched out using a punching machine.

The TAB leader tape can be obtained by extrusion sheeting using a composition comprising the polyphenylene ether-based resin as a raw material, or can be obtained by directly throwing a composition comprising the polyphenylene ether-based resin into an extrusion sheeting machine to simultaneously perform the blending and sheeting thereof.

The TAB leader tape can be produced using a method called tubular extrusion, or also an inflation method. It is essential in making the sheet uniformly thick and free from delamination to control the temperature of a parison through the circular die by selecting a proper temperature in the range of 50 to 290° C. so that the parison is not rapidly cooled.

The TAB leader tape can be produced by T-die extrusion. In this case, the sheet may be used directly in its non-oriented form, or after uniaxial or biaxial orientation to provide the tape. A desired increase in the strength of the sheet can be achieved by orientation.

The TAB leader tape of the present invention is excellent in water absorption resistance and punchability.

EXAMPLES

The present invention will be described below with reference to Examples. However, the invention is not limited to Examples is the scope thereof is maintained.

Production Example 1

Production Example for a Polyphenylene Ether (PPE-1)

PPE-1 is poly(2,6-dimethyl-1,4-phenylene ether) in powder form having a reduced viscosity (as measured in a 0.5 g/dl chloroform solution at 30° C.) of 0.42, obtained by oxidation polymerizing 2,6-dimethylphenol.

Production Example 2

Production Example for a Liquid Crystalline Polyester (LCP-1)

p-Hydroxybenzoic acid, 2-hydroxy-6-naphthoic acid, and acetic anhydride were charged, heat melted, and polycondensated in a nitrogen atmosphere to provide a liquid crystalline polyester (LCP-1) having the following theoretical structural formula. In this respect, the component ratio of the composition is indicated by a molar ratio.

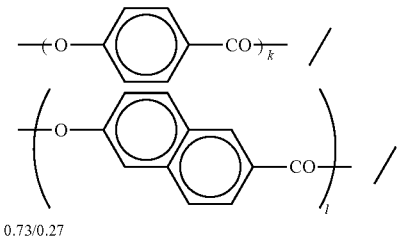

[Formulation 8]

k/l = 0.73/0.27

Forming of resin compositions into tapes and the evaluation of the physical properties of the tapes were performed according to the following methods.

(1) Tape Forming

The resultant pellets of each composition were subjected to sheeting by tubular extrusion blowing using an extruder with a screw diameter of 50 mm set at a cylinder temperature of 290° C. and a cylindrical dice temperature of 290° C. The blowing air pressure was set so as to provide a sheet thickness of 125 μm. The resultant sheets were each cut to a width of 35 mm.

(2) Water Absorption Resistance

The TAB leader tapes obtained in the tape forming step (1) were each used to cut out samples therefrom to have a length of 1 m, which were then exposed to a hot and humid environment of a temperature of 85° C. and a relative humidity of 95% for 48 hours using a thermo-hygrostat (PL-3FP manufactured by Tabai Espec Corporation), followed by determining the weight increase rate (Δw) according to the following equation. The mean value in the respective two samples was taken.

$$\text{Weight increase rate } (\Delta w)(\%) = (w1-w0)/w0 \times 100$$

(where w1 is the weight (g) of the tape which has been taken out of the thermo-hygrostat after 48 hours of exposure to the hot and humid environment, subjected to wiping-off of dew on the tape surface, and allowed to stand for 30 minutes in a room controlled at a temperature of 23° C. and a relative humidity of 50%; and w0 is the weight (g) of a tape which, before the warming and humidifying, has been dried in a hot air drier at 100° C. for 2 hours and cooled to room temperature in a desiccator.)

The water absorption resistance of the tapes was evaluated based on the following criteria.
Good: Δw is less than 0.1%.
Fair: Δw is 0.1% to less than 0.4%.
Poor: Δw is more than 0.4%.

(3) Heat Resistance

The tapes obtained in the tape forming step (1) were each used to cut out samples therefrom to have a length of 20 cm, which were then placed in a hot air drying oven (Perfect Oven PHH-201 manufactured by Espec Corporation) set at a temperature of 170° C. for one hour, followed by taking out the samples and observing the presence of the deformation thereof with eyes.
Good: No deformation is observed.
Poor: Deformation is observed.

(4) Thermal Shrinkage

The TAB leader tapes obtained in the tape forming step (1) were each used to cut out samples therefrom to have a length of 1 m, which were then placed in a hot air drying oven (Perfect Oven PHH-201 manufactured by Espec Corporation) set at a temperature of 170° C. for one hour, followed by taking out the samples. The samples were sufficiently cooled to room temperature, and the length thereof was then measured, followed by determining the dimensional change rates (ΔL) according to the following equation. The mean value in the respective two samples was taken.

Dimensional change rate $(\Delta L)(\%)=(L1-L0)/L0\times100$ (where L1 is the length after heating; and L0 is the length before heating)

The thermal shrinkage of the tapes was evaluated based on the following criteria.

Excellent: The dimensional change rate is less than 0.05%.
Good: The dimensional change rate is 0.05% to less than 0.1%.
Fair: The dimensional change rate is 0.1% to less than 0.2%.
Poor: The dimensional change rate is 0.2% or more.

(5) Punchability

Films 300 m long from the tapes were each subjected to the punching of holes 1 mm per side at an interval of 5 mm thereinto using a continuous film-punching machine, and the punchability thereof was evaluated according to the following criteria.

Good: Burrs extending like whiskers on the top and bottom of the holes are not seen at all and the occurrence of powder is also not noted at all, in observing the film just from the side under a light microscope (50× magnification); microscopic cracks are also not seen around the hole in observing the film from above.

Fair: Burrs extending like whiskers on the top and bottom of the holes were not seen and the occurrence of powder was also not noted at all, in observing the film just from the side under a light microscope (50× magnification), but the occurrence of microscopic cracks are sometimes noted in the hole in observing the film from above.

Poor: Burrs extending like whiskers on the top and bottom of the holes are seen, or the occurrence of powder is noted, in observing the film just from the side under a light microscope (50× magnification).

Example 1

A polyphenylene ether (PPE-1) as component A, a liquid crystalline polyester (LCP-1) as component B, and zinc oxide (special grade ZnO manufactured by Wako Pure Chemical Industries Ltd.) as component C were blended in the proportions (part by mass) shown in Table 1, and melt kneaded using a twin-screw extruder equipped with a vent port (ZSK-25 manufactured by Coperion Corporation, screw diameter=25 mm, (screw length)/(screw diameter)=42) in which zone 1 on the feed side was set at 250° C. and zones 2 to 7 and the die head were set at 310° C., with a rotation speed of 300 rpm and a discharge rate of 12 kg/hr to provide pellets.

Using the pellets, a tape 125 μm thick and 35 mm wide was obtained by the above-described method. The tape evaluation was carried out according to the above-described method. The results are shown in Table 1.

A sample was cut out of the resultant TAB leader tape, and the glass transition temperature thereof during the second heating (2nd scan) was measured using DSC (Diamond DSC manufactured by Perkin-Elmer). Specifically, the transition temperature based on the polyphenylene ether-based resin was determined when the sample temperature was scanned from 50° C. to 300° C. (1st scan) at a rate of temperature increase of 20° C./min. before keeping the temperature for one minute, followed by scanning from 300° C. to 50° C. at a rate of temperature decrease of 20° C./min., keeping the temperature for one minute, and further scanning from 50° C. to 300° C. (2nd scan) at a rate of temperature increase of 20° C./min. As a result, the Tg was 213° C.

Example 2

Pellets were obtained and subjected to sheeting before obtaining a tape in the same way as in Example 1 except for the blending of an amino group-containing silane compound (silane 1, N-β(aminoethyl)γ-aminopropyltrimethoxysilane, KBM-603 manufactured by Shin-Etsu Chemical Co., Ltd.) as component D in the proportion (part by mass) shown in Table 1. The tape evaluation was carried out according to the above-described methods. The results are shown in Table 1.

Example 3

Pellets were obtained and subjected to sheeting before obtaining a tape in the same way as in Example 1 except for the use of a high impact polystyrene (HIPS, H9405 manufactured by PS Japan Corporation) as well as a polyphenylene ether (PPE-1) as component A and a hydrogenated product of a vinyl aromatic compound-conjugated diene compound block copolymer (SEBS, Tuftec H1051 (registered trade name) manufactured by Asahi Kasei Chemicals Corporation) as another component (component F) to blend these components in the proportions (part by mass) shown in Table 1. The tape evaluation was carried out according to the above-described methods. The results are shown in Table 1.

Example 4

Sheeting was carried out before obtaining a tape in the same way as in Example 1 except for the use of a modified PPE resin (Xyron X9102 (registered trade name) manufactured by Asahi Kasei Chemicals Corporation) (component A) as pellets. The tape evaluation was carried out according to the above-described methods. The results are shown in Table 1.

Examples 5 and 6

Tapes were obtained in the same way as in Example 1 except for the setting of the blending amounts of PPE-1, LCP-1, and zinc oxide, and PPE-1 and LCP-1 to the proportions shown in Table 1, followed by performing the tape evaluation. The results are shown together in Table 1.

Examples 7 and 8

Pellets were obtained and subjected to sheeting before obtaining tapes in the same way as in Example 2 except for the use of a high impact polystyrene (HIPS, H9405 manufactured by PS Japan Corporation) for blending in the proportions (part by mass) shown in Table 1. The tape evaluation was carried out according to the above-described methods. The results are shown in Table 1.

Example 9

Pellets were obtained and subjected to sheeting before obtaining a tape in the same way as in Example 1 except for the use of Aerosil R972 (hydrophobic type, special product, manufactured by Nippon Aerosil Co., Ltd.), a fumed silica, as an inorganic filler (component E) and the blending thereof in the proportion (part by mass) shown in Table 1. The tape evaluation was carried out according to the above-described methods. The results are shown in Table 1.

Example 10

Pellets were obtained and subjected to sheeting before obtaining a tape in the same way as in Example 5 except for the use of magnesium hydroxide (special grade Mg(OH)$_2$ manufactured by Wako Pure Chemical Industries Ltd.) as component C in the proportion (part by mass) shown in Table 1. The tape evaluation was carried out according to the above-described methods. The results are shown in Table 1.

Example 11

Pellets were obtained and subjected to sheeting before obtaining a tape in the same way as in Example 3 except for the setting of the blending amounts of the polyphenylene ether (PPE-1) and the high impact polystyrene to the proportions (part by mass) shown in Table 1. The tape evaluation was carried out according to the above-described methods. The results are shown in Table 1.

The glass transition temperature thereof was measured in the same way as in Example 1. As a result, the Tg was 162° C.

Reference Example

Using a polyphenylene ether (PPE-1), pellets was obtained in the same way as in Example 1 after setting the zones 2 to 7 and die head of an extruder at 330° C. Processing of the pellets was attempted according to the above-described method after changing the preset temperature of the sheeting machine to 310° C. However, the forming thereof into a film was given up because the film tube was not stabilized and the die line was conspicuous.

Comparative Example 1

Sheeting was carried out before obtaining a tape in the same way as in Example 1 except for the use of polyphenylene ether imide (PEI, Ultem 1000 (registered trade name) manufactured by GE Plastics) as pellets and the setting of the cylinder temperature in sheeting to 350° C. The tape evaluation was carried out according to the above-described methods. The results are shown in Table 1.

Comparative Example 2

Sheeting was carried out before obtaining a tape in the same way as in Example 1 except for the use of polyphenylene sulfide (PPS, Torelina A900 (registered trade name) manufactured by Toray Industries, Inc.) as pellets. The tape evaluation was carried out according to the above-described methods. The results are shown in Table 1.

Comparative Example 3

Sheeting was carried out before obtaining a tape in the same way as in Example 1 except for the use of polyethylene naphthalate having an intrinsic viscosity (as determined at 35° C. in a phenol/tetrachlorethine mixed solvent) of 0.62 dl/g as pellets. The tape evaluation was carried out according to the above-described methods. The results are shown in Table 1.

Table 1 shows that the tape made of a polyphenylene ether-based resin, obtained by the present invention, is excellent in water absorption resistance, heat resistance, heat shrinkability, and punchability and that the tape is a non-conventional, inexpensive, and excellent TAB leader tape.

Table 1

TABLE 1

| | | | Ex. 1 | Ex. 2 | Ex. 3 | Ex. 4 | Ex. 5 | Ex. 6 | Ex. 7 | Ex. 8 |
|---|---|---|---|---|---|---|---|---|---|---|
| Composition | (A) | PPE-1 | 95 | 95 | 85 | | 93 | 93 | 65 | 35 |
| | | HIPS | | | 15 | | | | 10 | 10 |
| | (B) | LCP-1 | 5 | 5 | | | 7 | 7 | 25 | 55 |
| | (C) | ZnO | 0.8 | | | | | 0.9 | | |
| | (C) | Mg(OH)2 | | | | | | | | |
| | (D) | Silane 1 | | 0.2 | | | | | 0.5 | 0.5 |
| | (E) | Inorganic Filler | | | | | | | | |
| | | Others SEBS | | | | 3 | | | | |
| | | Modified PPE X9102 | | | | | 100 | | | |
| | | PEI | | | | | | | | |
| | | PPS | | | | | | | | |
| | | PEN | | | | | | | | |
| Evaluation | | Water Absorption Resistance | Good | Good | Good | Good | Good | Good | Good | Good |
| | | Heat Resistance | Good | Good | Good | Good | Good | Good | Good | Good |
| | | Thermal Shrinkage | Excellent | Excellent | Good | Good | Good | Good | Excellent | Excellent |
| | | Punchability | Good | Good | Good | Good | Good | Fair | Fair | Poor |

| | | | Ex. 9 | Ex. 10 | Ex. 11 | Ref. Ex. | Comp. Ex. 1 | Comp. Ex. 2 | Comp. Ex. 3 |
|---|---|---|---|---|---|---|---|---|---|
| Composition | (A) | PPE-1 | 94 | 93 | 60 | 100 | | | |
| | | HIPS | | | 40 | | | | |
| | (B) | LCP-1 | 6 | 7 | | | | | |
| | (C) | ZnO | 0.8 | | | | | | |
| | (C) | Mg(OH)2 | | 0.9 | | | | | |
| | (D) | Silane 1 | | | | | | | |
| | (E) | Inorganic Filler | 4 | | | | | | |
| | | Others SEBS | | | | | | | |
| | | Modified PPE X9102 | | | | | | | |

TABLE 1-continued

|  |  |  |  |  |  |  |  |
|---|---|---|---|---|---|---|---|
|  | PEI |  |  |  | 100 |  |  |
|  | PPS |  |  |  |  | 100 |  |
|  | PEN |  |  |  |  |  | 100 |
| Evaluation | Water Absorption Resistance | Good | Good | Good | — | Poor | Good | Fair |
|  | Heat Resistance | Good | Good | Fair | — | Good | Good | Good |
|  | Thermal Shrinkage | Excellent | Good | Fair | — | Good | Fair | Poor |
|  | Punchability | Good | Good | Good | — | Poor | Poor | Poor |

The above-described films were each slit at a width of 25 mm along the longitudinal MD direction, and subjected to tensile testing at a distance between chucks of 50 mm and a pulling rate of 50 mm/min. using a universal testing machine (Model 5581, St (load cell capacity: 0.5 kN) manufactured by Instron Corporation).

The initial moduli (Young's moduli) (MPa) thereof were each measured at ambient temperatures of 23° C., 140° C., and 170° C. The results are shown in Table 2.

Strain-stress curves (S-S carves) based on data at 140° C. are shown in FIG. 1.

PPE: The 125 μm thick film of the present invention, obtained in Example 1.

PEN: Teonex (registered trade name) Q51, a polyethylene naphthalate film manufactured by Teijin Chemicals Ltd. Thickness: 125 μm.

PET: Lumirror (registered trade name) T60, a polyethylene terephthalate film manufactured by Toray Industries, Inc. Thickness: 125 μm.

As shown in Table 2 and FIG. 1, the TAB leader tape made of a polyphenylene ether-based resin of the present invention has a reduced temperature dependency of initial modulus and exhibits a sufficiently high initial modulus even at a high temperature of 170° C. As such, the TAB leader tape has a sufficient hot rigidity; therefore, it is little stretched even in a state of applying tension thereto.

Table 2

TABLE 2

| | Young's Modulus (MPa) | | |
|---|---|---|---|
| | Temp (° C.) | | |
| | 23 | 140 | 170 |
| PPE | 2100 | 1600 | 1400 |
| PEN | 6100 | 1600 | 800 |
| PET | 4200 | 800 | 400 |

The TAB leader tape comprising a polyphenylene ether-based resin of the present invention is excellent in water absorption resistance and punchability. It is necessary that a TAB leader tape do not become deformed even when heated in an oven in the process of curing a sealing agent for semiconductor devices mounted on the TAB and exhibit a substantially equivalent thermal shrinkage rate as compared to a TAB tape and a TAB spacer tape. In addition, there is a need for a TAB leader tape which is inexpensive, low in density, and excellent in water absorption resistance and, particularly, which is excellent in punchability because elongated whisker-like pieces generated as burrs can be injurious to semiconductor devices. Thus, the TAB leader tape comprising a polyphenylene ether-based resin of the present invention has highly suitable TAB leader tape characteristics and is of extremely high industrial value.

The invention claimed is:

1. A method comprising:
    using a film as a TAB leader tape, the film comprising 45 parts by mass or more of a polyphenylene ether-based resin and 55 parts by mass or less of at least one component selected from a thermoplastic resin and a plasticizer based on 100 parts by mass of the film, and the film optionally including inorganic filler and one or more other additional components,
    wherein the polyphenylene ether-based resin consists of 0.5 to 50 parts by mass of an aromatic vinyl-based polymer and 50 to 99.5 parts by mass of a polyphenylene ether-based polymer based on the total 100 parts by mass of the polyphenylene ether-based resin,
    wherein the thermoplastic resin is at least one resin selected from the group of polyamides, polyolefins, polyacrylic polymers, thermoplastic polyamide, copolymers of acrylic monomers and olefines, and polyurethane,
    wherein the one or more other additional components are selected from the group of an antioxidant, an elastomer, a flame retardant auxiliary, a weather resistance-improving agent, a light resistance-improving agent, a nucleating agent for polyolefins, and a colorant, and
    wherein the film does not contain liquid crystalline polyester.

2. The method according to claim 1, wherein the polyphenylene ether-based resin consists of 0.5 to 30 parts by mass of an aromatic vinyl-based polymer and 70 to 99.5 parts by mass of a polyphenylene ether-based polymer based on the total 100 parts by mass of the polyphenylene ether-based resin.

3. The method according to claim 1, wherein the film comprises 0.1 to 150 parts by mass of the inorganic filler based on 100 parts by mass of the polyphenylene ether-based resin.

4. The method according to claim 1, further comprising:
    punching out guide holes from opposite sides of the film;
    connecting the film to at least one of a winding start and a winding end of a TAB tape; and
    meshing the guide holes with a roll.

5. The method according to claim 2, wherein the film comprises 0.1 to 150 parts by mass of the inorganic filler based on 100 parts by mass of the polyphenylene ether-based resin.

* * * * *